United States Patent
Ziazadeh et al.

(10) Patent No.: US 7,869,388 B2
(45) Date of Patent: Jan. 11, 2011

(54) CLASS-B TRANSMITTER AND REPLICA TRANSMITTER FOR GIGABIT ETHERNET APPLICATIONS

(75) Inventors: Ramsin Michael Ziazadeh, San Jose, CA (US); Varadarajan Devnath, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/800,959

(22) Filed: May 26, 2010

(65) Prior Publication Data

US 2010/0238848 A1 Sep. 23, 2010

Related U.S. Application Data

(62) Division of application No. 11/208,227, filed on Aug. 19, 2005, now Pat. No. 7,729,300.

(51) Int. Cl.
*H04B 1/56* (2006.01)
*H03M 1/66* (2006.01)

(52) U.S. Cl. ....................... 370/276; 341/144

(58) Field of Classification Search ......... 341/143–154; 327/540, 541, 543, 538; 375/296, 297; 333/165, 333/166; 323/316; 330/251
See application file for complete search history.

(56) References Cited

U.S. PATENT DOCUMENTS

| | | | | |
|---|---|---|---|---|
| 5,001,484 A * | 3/1991 | Weiss | | 341/153 |
| 5,180,995 A * | 1/1993 | Hayashi et al. | | 331/57 |
| 5,373,249 A * | 12/1994 | Barrett et al. | | 330/264 |
| 5,651,029 A * | 7/1997 | Yang et al. | | 375/296 |
| 5,856,742 A * | 1/1999 | Vulih et al. | | 323/315 |
| 6,057,721 A * | 5/2000 | Nolan et al. | | 327/143 |
| 6,249,164 B1 * | 6/2001 | Cranford et al. | | 327/270 |
| 6,462,688 B1 * | 10/2002 | Sutardja | | 341/144 |
| 6,509,854 B1 * | 1/2003 | Morita et al. | | 341/144 |
| 6,721,379 B1 * | 4/2004 | Cranford et al. | | 375/376 |
| 6,744,831 B2 * | 6/2004 | Chan | | 375/346 |
| 6,777,885 B2 * | 8/2004 | Koyama | | 315/169.1 |
| 6,798,828 B1 * | 9/2004 | Phanse | | 375/219 |
| 6,809,673 B2 * | 10/2004 | Scanlan et al. | | 341/144 |
| 6,844,837 B1 * | 1/2005 | Sutardja et al. | | 341/144 |
| 6,897,619 B2 * | 5/2005 | Shimizu | | 315/169.3 |
| 6,958,742 B2 * | 10/2005 | Date et al. | | 345/90 |
| 7,046,752 B2 * | 5/2006 | Chan | | 375/346 |
| 7,095,348 B1 * | 8/2006 | Sutardja et al. | | 341/144 |

(Continued)

OTHER PUBLICATIONS

"Electronic amplifier", www.wikipedia.org, Aug. 1, 2005, 9 pages.

*Primary Examiner*—James H. Cho
*Assistant Examiner*—Matthew C Tabler

(57) ABSTRACT

A method and apparatus for a Gigabit Ethernet transceiver that has a Class-B amplifier in a main transmitter for higher efficiency and power handling capabilities. The output current of the main transmitter is produced by a reference voltage applied across a resistor, where the reference voltage generator, resistor and amplifier are fabricated on the same substrate, such that the output current is constant across process voltage and temperature. The transceiver also has a replica transmitter whose signal is used to cancel the main transmitter signal at the input of the receiver section of the transceiver. The replica transmitter is fabricated on the same substrate as the main transmitter, such that its output signal reflects non-linearities in the main transmitter across process voltage and temperature.

20 Claims, 2 Drawing Sheets

U.S. PATENT DOCUMENTS

| | | | |
|---|---|---|---|
| 7,113,121 B1 * | 9/2006 | Sutardja et al. | 341/144 |
| 7,145,379 B2 * | 12/2006 | Date et al. | 327/431 |
| 7,262,652 B2 * | 8/2007 | Omori et al. | 327/538 |
| 7,289,087 B2 * | 10/2007 | Date | 345/76 |
| 7,298,173 B1 * | 11/2007 | Jiang et al. | 326/83 |
| 7,312,662 B1 * | 12/2007 | Roo et al. | 330/311 |
| 7,312,739 B1 * | 12/2007 | Sutardja et al. | 341/144 |
| 7,321,326 B2 * | 1/2008 | Imai | 341/144 |
| 7,327,170 B2 * | 2/2008 | Omori et al. | 327/108 |
| 7,327,298 B2 * | 2/2008 | Zabroda | 341/144 |
| 7,365,594 B2 * | 4/2008 | Kojima et al. | 327/538 |
| 7,477,094 B2 * | 1/2009 | Date et al. | 327/538 |
| 7,508,236 B2 * | 3/2009 | Lai et al. | 326/86 |
| 7,554,387 B1 * | 6/2009 | Sakurai | 327/538 |
| 7,557,743 B2 * | 7/2009 | Imai | 341/144 |
| 2003/0067345 A1 * | 4/2003 | Blankenship et al. | 327/538 |
| 2004/0046681 A1 * | 3/2004 | Frulio et al. | 341/144 |
| 2004/0105504 A1 * | 6/2004 | Chan | 375/257 |
| 2004/0178742 A1 * | 9/2004 | Date et al. | 315/169.3 |
| 2004/0227499 A1 * | 11/2004 | Date et al. | 323/315 |

\* cited by examiner

CLASS-B TRANSMITTER AND REPLICA TRANSMITTER FOR GIGABIT ETHERNET APPLICATIONS

This application is a divisional of prior U.S. patent application Ser. No. 11/208,227 filed on Aug. 19, 2005 which issued on Jun. 1, 2010 as U.S. Pat. No. 7,729,300.

TECHNICAL FIELD OF THE INVENTION

The present invention relates generally to Gigabit Ethernet transceivers and, more particularly, to a transceiver employing a Class-B transmitter and replica transmitter.

BACKGROUND OF THE INVENTION

A local area network operating under the Gigabit Ethernet standard includes transceiver nodes communicating with each other in a full-duplex mode; that is, transmitting in both directions simultaneously at full bandwidth within a particular frequency band. The transceivers typically have a transformer at their output, with a communication cable electrically connecting the transformers of the two transceivers.

Within the transceiver, both a transmitter section and a receiver section are coupled to the transformer and, necessarily, to each other. Without additional circuitry, the signal at the input to the receiver will include both a received signal from the communication cable and a signal from the transmitter section. The received signal, having been attenuated in the cable, will typically be at a lower signal strength than the signal from the transmitter section within the transceiver.

Signal isolation between the transmitter and receiver sections of a transceiver may be obtained with a costly, transformer-based, hybrid electrical bridge circuit. However, the degree of isolation provided by such bridge circuits is dependent upon how closely the terminating impedance of the bridge matches the impedance of the communication cable. Because the impedance of the communication cable is dynamic, over time more or less of the transmitter signal is present at the input of the receiver to interfere with detection of the received signal.

An alternative technique for reducing the signal strength of the signal from the transmitter section involves generating within the transceiver a signal to cancel the transmitter signal. A signal that is identical to the transmitter signal, but having inverse polarity, is mixed with the combination of transmitter and received signal in order to cancel some portion of the transmitter signal. As a result, the signal-to-noise ratio of the received signal is improved.

However, the efficacy of this technique depends upon the degree to which the cancellation signal matches the transmitter signal. Differences between the two signals will result not only in some portion of the transmitter signal not being cancelled out, but may also inject additional noise into the signal at the input of the receiver. Merely matching the transmitter input signal is not enough, the non-linearities of the transmitter circuitry must also be matched in order for the technique to be fully effective.

Other challenges in implementing a Gigabit Ethernet network arise from the transformer coupling of the transceiver nodes. A transformer presents the transmitter circuitry with a characteristic impedance load. Because transmitters are typically implemented as current source/sink circuits, and the communication standards require that signal levels of a certain voltage be produced in the network, the power-handling requirement of transmitters is directly related to the impedance load presented by the transformers. As the impedance load is reduced, the transmitter must source/sink proportionately more current to produce the required signal voltages.

Since the communication cable is double terminated (i.e., is transformer coupled at both ends of the cable), the two transformers are in parallel and together present to the transmitter half the impedance of a single transformer. This requires a transmitter design that provides twice the power. Furthermore, where a transmitter is implemented with circuitry that only sinks current, the transformer is typically provided with a center tap connected to a voltage source. Because the transmitter is only driving half the transformer, the load impedance is halved again, requiring another doubling of the power handled by the transmitter circuitry.

Circuit designs typically used in Ethernet transmitters may not successfully scale up to the power levels required in such networks. The amplifiers and circuit sources used may become non-linear at these increased power levels, resulting in degraded functionality or failure to meet communications standards.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
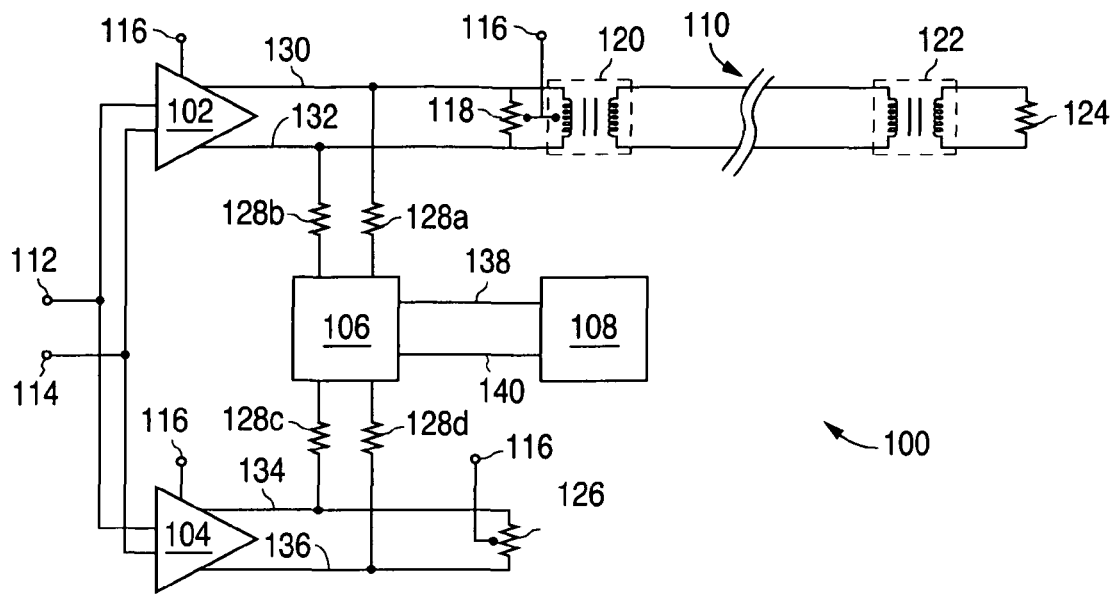
FIG. 1 illustrates a transceiver embodying aspects of the present invention.
Figure 3:
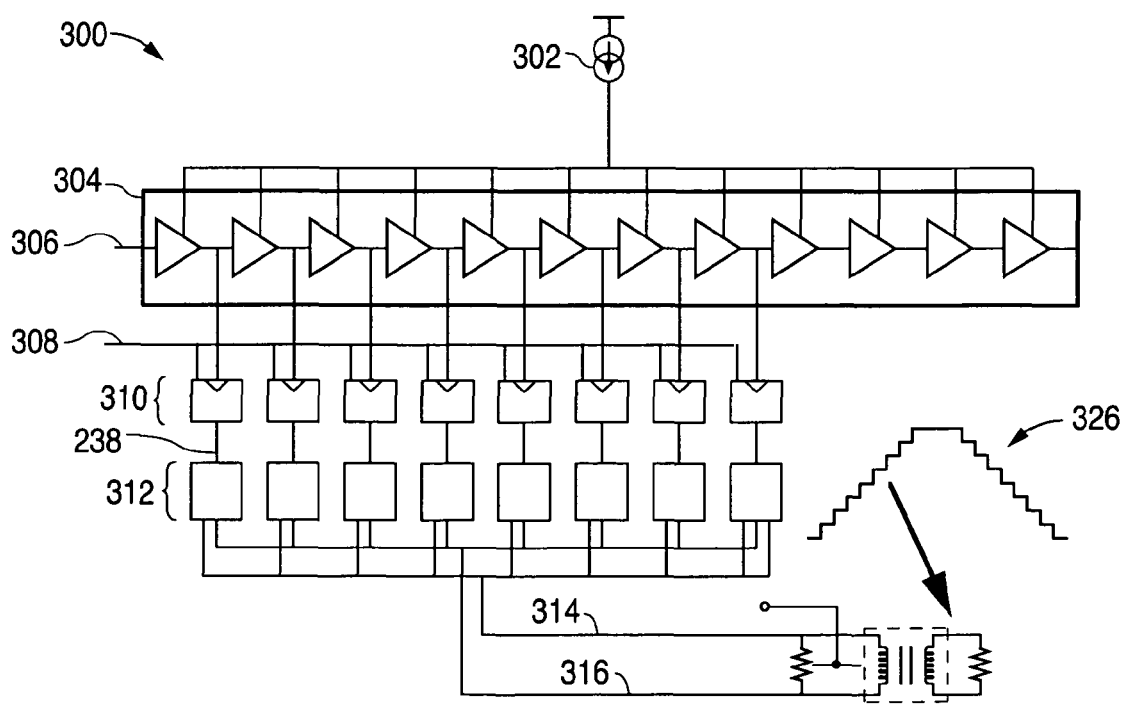
FIG. 3 is a transmitter architecture embodying aspects of the present invention.
Figure 2:
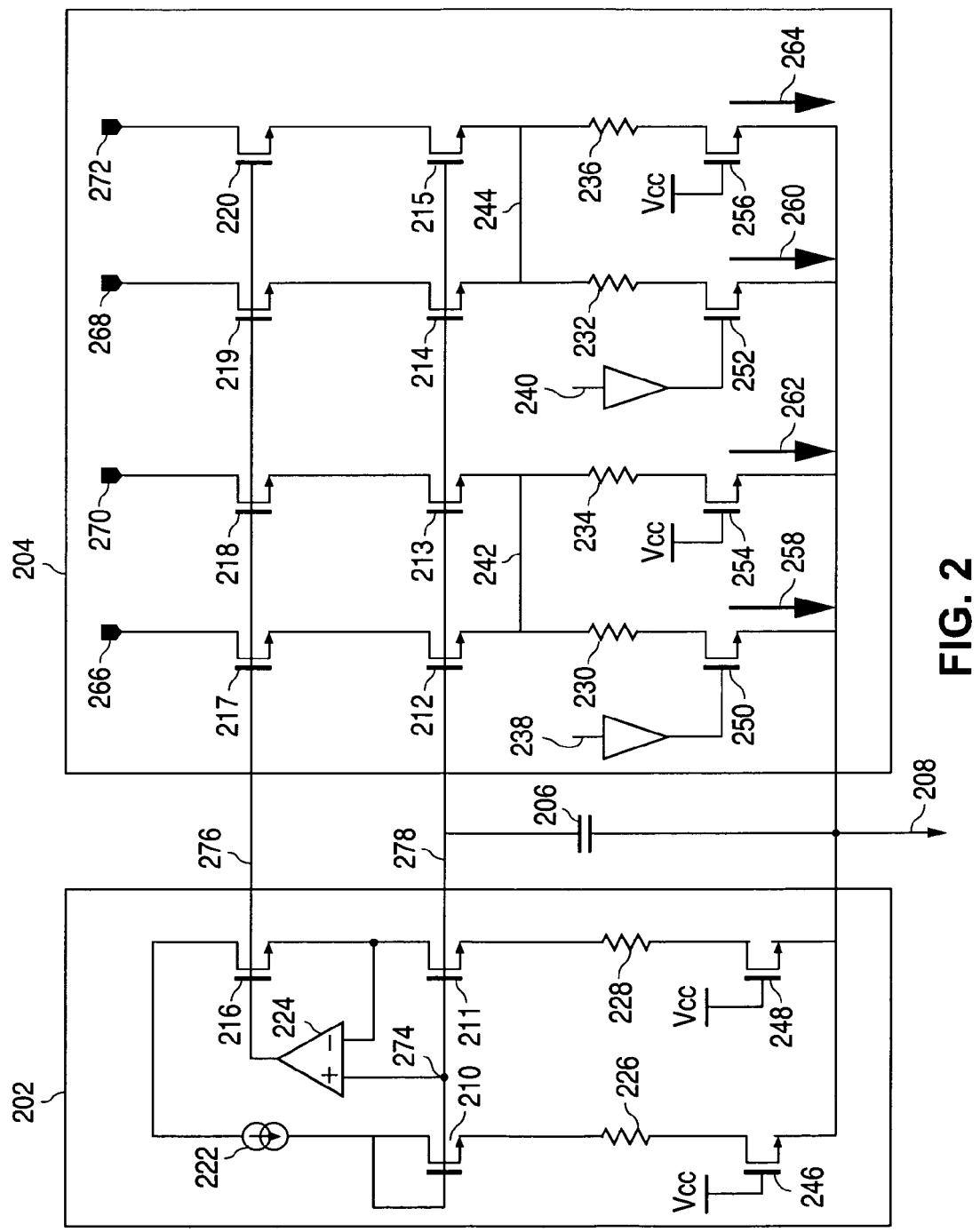
FIG. 2 depicts a transmitter and replica transmitter according to the present invention.

FIGS. 1-3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged operational amplifier.

A Gigabit Ethernet transceiver is disclosed that employs a Class-B amplifier in a main transmitter for higher efficiency and power handling capabilities. The output current of the main transmitter is set by a reference voltage divided by a resistor fabricated on the same substrate as the amplifier, such that the output current is constant across process voltage and temperature. A replica transmitter is also fabricated on the same substrate, such that its output signal reflects any non-linearities in the main transmitter.

FIG. 1 illustrates a Gigabit Ethernet transceiver 100 embodying aspects of the present invention. A main transmitter 102 receives input signals DATA 112 and $\overline{DATA}$ 114 and voltage source $V_{CC}$ 116 and drives transmitter signals $V_{TX}^+$ and $V_{TX}^-$ onto communication lines 130 and 132, respectively. The communication lines 130 and 132 are also coupled to a termination resistor 118 and the primary of a line isolation transformer 120. The center taps of the termination resistor 118 and the line isolation transformer 120 are coupled to voltage source $V_{CC}$ 116. The secondary of the line isolation transformer 120 is coupled to communication cable 110, which is coupled at its other end, in another transceiver, to the secondary of a line isolation transformer 122. The primary of the line isolation transformer 122 is coupled to a termination resistor 124.

Also coupled to the primary of the line isolation transformer 122 is a transmitter (not shown) that transmits data signals for reception by the transceiver 100. Those received signals appear on the primary of the line isolation transformer 120 and, thus, on communication lines 130 and 132 as $V_{RX}^+$ and $V_{RX}^-$, respectively. As a result, the communication line 130 carries the combined signal $V_{TX}^+ + V_{RX}^+$ and the communication line 132 carries the combined signal $V_{TX}^- + V_{RX}^-$. As described above, the amplitude of the received signal has been attenuated in the transmission process, with the result that the $V_{TX}$ component of the combined signal is at a significantly higher amplitude than the $V_{RX}$ component.

In order to reduce the level of the $V_{TX}$ component in the signal presented to the input of a receiver 108, a replica transmitter 104 is provided. The replica transmitter 104 receives the same data input signals DATA 112 and $\overline{DATA}$ 114 and voltage source $V_{CC}$ 116 as the main transmitter 102 and drives replica transmitter signals $V_{RTX}^+$ and $V_{RTX}^-$ onto communication lines 134 and 136, respectively. The output of replica transmitter 104 is coupled to a termination resistor 126, which has a center tap coupled to voltage source $V_{CC}$ 116. The value of the terminating resistor 126 is greater than that of the terminating resistor 118, coupled to the main transmitter 102, by a factor of N such that the power requirements of the replica transmitter 104 are smaller than those of the main transmitter 102 by the factor N.

The communication lines 130 and 132 are coupled to the inputs of a low-impedance summing node 106 through resistors 128a and 128b. Likewise, the output of the replica transmitter 104 is coupled to the other inputs of the summing node 106 through resistors 128c and 128d. The summing node 106 operates to combine $V_{RTX}^-$ with $V_{TX}^+ + V_{RX}^+$ and to combine $V_{RTX}^+$ with $V_{TX}^- + V_{RX}^-$. The result is that the summing node 106 outputs 138 and 140 carry signals $V_{RX}^+ + (V_{TX}^+ + V_{RTX}^-)$ and $V_{RX}^- + (V_{TX}^- + V_{RTX}^+)$, respectively. The outputs 138 and 140 are coupled to the input of the receiver 108. As may be seen, the transmitted signal $V_{TX}$ is reduced by the replica signal $V_{RTX}$ in the signal presented to the input of the receiver 108.

As will be seen with regard to FIG. 2, in an embodiment of the present invention, the main transmitter 102 and the replica transmitter 108 may be fabricated on a single substrate. By so doing, an improved linearity of the output current of the main transmitter and an improved match between the output signals of the main and replica transmitters may be obtained. FIG. 2 illustrates a bias generator 202, a switch noise coupling capacitor 206, and a single digital-to-analog converter (DAC) segment 204. The DAC segment 204 may be replicated, as will be shown with regard to FIG. 3, to produce a complete transmitter with controllable rise and fall times.

The bias generator 202 includes a reference current generator 222 generating reference current $I_{REF}$ and connected to the drain and gate of diode-connected transistor 210. The source of the transistor 210 is coupled through a resistor 226 and always-on transistor 246 to ground 208. The current $I_{REF}$ flowing through the resistor 226 and the transistor 246 produces voltage $V_{REF}$. There is also a voltage drop $V_{GS}$ across the gate-source junction of the transistor 210, thus the voltage at node 274 and at output 278 of the bias generator 202 has the value $V_{REF} + V_{GS}$.

The bias generator 202 also includes a cascode transistor 216, a source follower transistor 211, a resistor 228, and a switch transistor 248 that mirror a comparable string of components in the DAC segment. An operational amplifier 224 has its non-inverting input connected to node 274, its inverting input connected to the source of the cascode transistor 216, and its output connected to the gate of the cascode transistor 216. As a result, a voltage that is equal to $V_{REF} + 2^*V_{GS}$ is generated at output 276 of the bias generator 202.

The reference voltages at the outputs 276 and 278 of the bias generator 202 are supplied to the DAC segment 204 and other similar DAC segments, not shown in FIG. 2. A switch noise coupling capacitor 206 is connected between the output 278 of the bias generator 202 and ground 208. The function of capacitor 206 will be described below.

The DAC segment 204 receives data signals DATA and $\overline{DATA}$ at inputs 238 and 240, respectively. Main transmitter outputs $V_{TX}^+$ and $V_{TX}^-$ are produced at outputs 266 and 268, respectively. Replica transmitter outputs $V_{RTX}^+$ and $V_{RTX}^-$ are produced at outputs 270 and 272, respectively. Source follower transistors 212-215 and cascode transistors 217-220 provide higher output impedances for outputs 266, 270, 268 and 272, respectively. Leakage resistors 234 and 236 and always-on switch transistors 254 and 256 provide leakage currents 262 and 264 through transistors 212-215 and 217-220 in order to optimize the turn-on time of the transistors.

Because the bias generator 202 controls the reference voltage at the gates of the source follower transistors 212-215 to be $V_{REF} + V_{GS}$ and the voltage at the gates of the cascode transistors 217-220 to be $V_{REF} + 2^*V_{GS}$, the voltage at the sources of the transistors 212-215 (i.e., at nodes 242 and 244) is held at $V_{REF}$. As a result, when input 238 is high, switch transistor 250 conducts and the output current 258 is equal to $V_{REF}$ divided by the combined serial resistance R of resistor 230 and the switch transistor 250. Similarly, when input 240 is high, switch transistor 252 conducts and the output current 260 is equal to $V_{REF}$ divided by the combined serial resistance R of resistor 232 and the switch transistor 252.

When both inputs 238 and 240 are low, both switches 250 and 252 are off, and the output currents 258 and 260 are zero. As noted above, leakage current will continue to flow through the resistors 234 and 236 and transistors 254 and 256. However, this current is sufficiently close to zero that Class-B operation is achieved. By producing output current on output 266 or output 268, or on neither output, the DAC segment is able to drive a +1, −1, or 0, as required for MLT-3 Ethernet modulation. However, it will be obvious to one skilled in the art that the techniques of the present invention may also be used for PAM-5 or NRZ modulation schemes or other similar modulation schemes.

In order to produce a balanced signal, the resistors 230 and 232 are fabricated to equal each other. For similar reasons, the resistors 234 and 236 are fabricated to equal each other. The resistors 226 and 228 in the bias generator are fabricated to each have a resistance equal to the combined resistances of the resistor 230 in series with the switch 250 in parallel with the leakage resistor 234 in series with the transistor 254. In this way, when the switch transistor 250 conducts, the output current 258 will be equal to the reference current $I_{REF}$ produced by the reference current generator 222 in is the bias generator 202.

The replica transmitter outputs 270 and 272 may be constructed to have a lower power level (i.e., have higher output impedance) than the main transmitter outputs 266 and 268 by making the source follower transistors 213 and 215 smaller than the transistors 212 and 214 by a factor of N. For linearity and matching purposes, it is preferable that the transistor area of the transistors 212 and 214 match the transistor areas of the transistors 213 and 215.

Because the nodes 242 and 244 are strictly maintained at the voltage $V_{REF}$ and the resistors 230 and 232 are linear, the output currents 258 and 260 are produced with great linearity. Such linearity would not be possible with a transmitter using a current source instead of a resistor, due to the charge injection into the current-source gate bias line. This charge injection would result in modulating the bias current (data dependant bias current) and cause non-linearities to be introduced into the output currents 258 and 260. Furthermore, because the bias generator 202 and the DAC segment 204 are fabricated on a single substrate, the matching of the components of the bias generator 202 and the DAC segment 204 are improved across process voltage and temperature, producing greater linearity in the output currents 258 and 260. Similarly, because all the components of the DAC segment 204 are fabricated on a single substrate, the matching between replica transmitter signal $V_{RTX}$ and main transmitter $V_{TX}$ is improved across process voltage and temperature, resulting in better cancellation of $V_{TX}$ at the input of the receiver 108.

As will be discussed with regard to FIG. 3, a transmitter embodying aspects of the present invention may be constructed of a single bias generator 202 and several DAC segments 204 connected in parallel. The capacitor 206, having capacitance $C_C$, is preferably used to reduce the switching noise on the line 278 as DAC segments switch on and off. Since the line 278 is common to all the DAC segments, this line must be low-impedance at high switching frequencies. Switching noise is generated by the voltage variation across, for example, the resistor 230 in the DAC segment 204 as the current through the resistor 230 goes from zero to $I_{REF}$. This voltage variation couples into the line 278 by the $C_{GS}$ coupling of the source follower transistors 212 and 213. The voltage variation in the line 278 causes non-linearities in the output signals $V_{TX}$ and $V_{RTX}$ and must be reduced to achieve high linearity specifications.

The noise coupling factor is a function of $C_{GS(TOTAL)}$ divided by $(C_{GS(TOTAL)}+C_C)$, where $C_{GS(TOTAL)}$ is the sum of the $C_{GS}$ values of the source follower transistors 212, 213, 214 and 215. Thus, to effectively reduce the noise coupling factor, the capacitance of the capacitor 206 may be chosen to be large in comparison to $C_{GS(TOTAL)}$.

An exemplary transmitter section according to the present invention is illustrated in FIG. 3. Eight DAC segments 312, as described with regard to FIG. 2, have their main transmitter outputs 266 and 268 connected in parallel to communication lines 314 and 316. The DATA input 238 of each DAC segment is individually connected to one of eight gates 310. The data inputs of all the gates 310 are connected to DATA transmitter input 308. The clock inputs of the gates 310 are connected to individual taps of a shift register 304 having as its inputs clock signal 306 and delay-locked current source 302. Not shown in FIG. 3 is a similar set of eight gates used to gate transmitter input $\overline{DATA}$ into the $\overline{DATA}$ input 240 of each DAC segment 312. As the input clock signals sequentially gate the DATA and $\overline{DATA}$ inputs of the DAC segments 312, the output currents of the DAC segments are summed in communication lines 314 and 316 to produce a voltage waveform 326 having controlled rise and fall times.

Although the present invention has been described with an exemplary embodiment, various changes and modifications may be suggested to one skilled in the art. It is intended that the present invention encompass such changes and modifications as fall within the scope of the appended claims.

What is claimed is:

1. A full-duplex transceiver for transmitting and receiving a signal on a differential pair channel, comprising:
   a transmitter comprising, on a common substrate:
      a bias generator configured to generate a transmitter reference voltage equal to $V_{REF}+V_{GS}$, and
      a DAC segment coupled to the bias generator, the DAC segment comprising:
         first and second main source follower transistors, each main source follower transistor having a gate configured to receive the reference voltage and a drain coupled to the differential pair channel,
         first and second replica source follower transistors, each replica source follower transistor having a gate configured to receive the reference voltage,
         a first Class B amplifier having a resistance R and coupling sources of the first main and first replica source follower transistors to ground, and
         a second Class B amplifier having the resistance R and coupling sources of the second main and second replica source follower transistors to ground;
   a receiver having an input; and
   a summing node connected to the differential pair channel, drains of the replica source follower transistors, and the input of the receiver, the summing node configured to combine the signal on the differential pair channel and signals from the replica source follower transistors such that signals from the main source follower transistors are reduced in a signal at the input of the receiver,
   wherein:
      a gate-source voltage drop across one of the source follower transistors is $V_{GS}$,
      a voltage at the sources of the source follower transistors is $V_{REF}$, and
      an output current generated by the transmitter at the drains of the source follower transistors when the Class B amplifier is on is $V_{REF}/R$.

2. The transceiver of claim 1, the transmitter further comprising:
   a switch noise reduction capacitor connected in parallel between the gates of the source follower transistors and ground, wherein a capacitance of the switch noise reduction capacitor is larger than a sum of gate-source capacitances of the source follower transistors.

3. The transceiver of claim 1, the bias generator comprising:
   a reference current source;
   a diode connected transistor having a gate and a drain coupled to the reference current source and to the gates of the source follower transistors; and a switched on Class B amplifier having the resistance R coupled in series between a source of the diode connected transistor and ground.

4. The transceiver of claim 1, wherein the replica source follower transistors are smaller than the main source follower transistors by a specified factor.

5. The transceiver of claim 1, wherein transistor areas of the replica source follower transistors match transistor areas of the main source follower transistors.

6. The transceiver of claim 1, the transmitter further comprising:
first and second cascode transistors coupling the drains of the main and replica source follower transistors to the differential pair channel and summing node, respectively,
wherein the bias generator is configured to generate a second reference voltage equal to $V_{REF}+2*V_{GS}$ that is coupled to gates of the cascode transistors.

7. The transceiver of claim 1, the transmitter further comprising:
first and second resistors each having a resistance $R_{LEAKAGE}$ and coupled in parallel to the first and second Class B amplifiers, respectively, between the sources of the first main and first replica source follower transistors and ground and the sources of the second main and second replica source follower transistors and ground, respectively,
wherein the output current is the sum of $V_{REF}/R$ and $V_{REF}/R_{LEAKAGE}$.

8. A full-duplex transceiver for transmitting and receiving a signal on a differential pair channel, comprising:
a transmitter comprising:
a bias generator configured to generate a transmitter reference voltage; and
a DAC segment comprising:
first and second main source follower transistors each having a gate configured to receive the transmitter reference voltage and a drain coupled to the differential pair channel;
first and second replica source follower transistors each having a gate configured to receive the transmitter reference voltage;
a first Class B amplifier coupling sources of the first main and first replica source follower transistors to ground;
a second Class B amplifier coupling sources of the second main and second replica source follower transistors to ground; and
a switch noise reduction capacitor connected in parallel between the gates of the source follower transistors and ground, a capacitance of the switch noise reduction capacitor larger than a sum of gate-source capacitances of the source follower transistors;
a receiver having an input; and
a summing node configured to combine the signal on the differential pair channel and signals from the replica source follower transistors such that signals from the main source follower transistors are reduced in a signal at the input of the receiver.

9. The transceiver of claim 8, wherein all of the source follower transistors are located on a common substrate.

10. The transceiver of claim 8, wherein the bias generator comprises:
a reference current source;
a diode connected transistor having a gate and a drain coupled to the reference current source and to the gates of the source follower transistors; and
a switched on Class B amplifier coupled in series between a source of the diode connected transistor and ground.

11. The transceiver of claim 8, wherein the replica source follower transistors are smaller than the main source follower transistors by a specified factor.

12. The transceiver of claim 8, wherein transistor areas of the replica source follower transistors match transistor areas of the main source follower transistors.

13. The transceiver of claim 8, wherein the transmitter further comprises:
first and second cascode transistors coupling the drains of the main and replica source follower transistors to the differential pair channel and summing node, respectively;
wherein the bias generator is configured to generate a second reference voltage that is provided to gates of the cascode transistors.

14. The transceiver of claim 8, wherein the transmitter further comprises:
first and second resistors coupled in parallel to the first and second Class B amplifiers, respectively, between the sources of the first main and first replica source follower transistors and ground and the sources of the second main and second replica source follower transistors and ground, respectively.

15. A full-duplex transceiver, comprising:
a bias generator configured to generate a first reference voltage;
first and second source follower transistors each having a gate configured to receive the first reference voltage;
a first switch transistor coupled in series with the first source follower transistor, a gate of the first switch transistor configured to receive a data signal;
a second switch transistor coupled in series with the second source follower transistor, a gate of the second switch transistor configured to receive a supply voltage;
an operational amplifier having a first input and a second input, the first input configured to receive the first reference voltage, the operational amplifier configured to generate a second reference voltage; and
first, second, and third cascode transistors each having a gate configured to receive the second reference voltage, wherein the first cascode transistor is coupled in series with the first source follower transistor, the second cascode transistor is coupled in series with the second source follower transistor, and the third cascode transistor is coupled to the second input of the operational amplifier.

16. The transceiver of claim 15, further comprising:
a third source follower transistor coupled in series with the third cascode transistor and coupled to the second input of the operational amplifier, wherein a gate of the third source follower transistor is configured to receive the first reference voltage.

17. The transceiver of claim 16, further comprising:
a third switch transistor coupled in series with the third source follower transistor, wherein a gate of a third switch transistor is configured to receive the supply voltage.

18. The transceiver of claim 15, further comprising:
a switch noise reduction capacitor coupled to the gates of the source follower transistors and to ground, the switch noise reduction capacitor configured to reduce switching noise in the first reference voltage.

19. The transceiver of claim 15, wherein all of the source follower transistors, the switch transistors, and the cascode transistors are located on a common substrate.

20. The transceiver of claim 15, wherein the bias generator comprises:

a reference current source;

a diode connected transistor having a gate and a drain coupled to the reference current source and to the gates of the source follower transistors; and a switched on Class B amplifier coupled in series between a source of the diode connected transistor and ground.

\* \* \* \* \*